(12) United States Patent
Besinga et al.

(10) Patent No.: US 11,687,452 B2
(45) Date of Patent: Jun. 27, 2023

(54) DYNAMIC PROGRAM-VERIFY VOLTAGE ADJUSTMENT FOR INTRA-BLOCK STORAGE CHARGE LOSS UNIFORMITY

(71) Applicant: Micron Technology, Inc., Boise, ID (US)

(72) Inventors: Gary F. Besinga, Boise, ID (US); Renato C. Padilla, Folsom, CA (US); Tawalin Opastrakoon, Boise, ID (US); Sampath K. Ratnam, Boise, ID (US); Michael G. Miller, Boise, ID (US); Christopher M. Smitchger, Boise, ID (US); Vamsi Pavan Rayaprolu, San Jose, CA (US); Ashutosh Malshe, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 17/123,244

(22) Filed: Dec. 16, 2020

(65) Prior Publication Data
US 2022/0188226 A1     Jun. 16, 2022

(51) Int. Cl.
*G11C 16/04* (2006.01)
*G06F 12/06* (2006.01)
*G06F 1/28* (2006.01)
*G11C 16/34* (2006.01)
*G11C 16/10* (2006.01)

(52) U.S. Cl.
CPC ............ *G06F 12/0646* (2013.01); *G06F 1/28* (2013.01); *G11C 16/3459* (2013.01); *G06F 2212/1028* (2013.01); *G11C 16/10* (2013.01)

(58) Field of Classification Search
CPC . G11C 16/3459; G11C 16/10; G06F 12/0646; G06F 1/28; G06F 2212/1028
See application file for complete search history.

(56) References Cited

U.S. PATENT DOCUMENTS

2016/0300621 A1*  10/2016  Abe ................... G11C 16/3445

* cited by examiner

*Primary Examiner* — Uyen Smet
(74) *Attorney, Agent, or Firm* — Lowenstein Sandler LLP

(57) ABSTRACT

An amount of threshold voltage distribution shift is determined. The threshold voltage distribution shift corresponds to an amount of time after programming of a reference page of a block of a memory device. A program-verify voltage is adjusted based on the amount of threshold voltage distribution shift to obtain an adjusted program-verify voltage. Using the adjusted program-verify voltage, a temporally subsequent page of the block is programmed at a time corresponding to the amount of time after the programming of the reference page.

20 Claims, 4 Drawing Sheets

Determine at least one amount of threshold voltage (Vt) distribution shift corresponding to at least one amount of time after programming of a reference page of a block of a memory device
210

Adjust a program-verify (PV) voltage based on the amount of $V_t$ distribution shift to obtain an adjusted PV voltage
220

Store the adjusted PV voltage as programming data
230

Program, using the programming data, a temporally subsequent page of the block at a time corresponding to the amount of time after the programming of the reference page
240

DYNAMIC PROGRAM-VERIFY VOLTAGE ADJUSTMENT FOR INTRA-BLOCK STORAGE CHARGE LOSS UNIFORMITY

TECHNICAL FIELD

Embodiments of the disclosure relate generally to memory sub-systems, and more specifically, relate to dynamic program-verify (PV) voltage adjustment for intra-block storage charge loss (SCL) uniformity.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a flow diagram of a method to implement dynamic program-verify (PV) voltage adjustment for intra-block storage charge loss (SCL) uniformity in accordance with some embodiments of the present disclosure.

DETAILED DESCRIPTION

Figure 1:
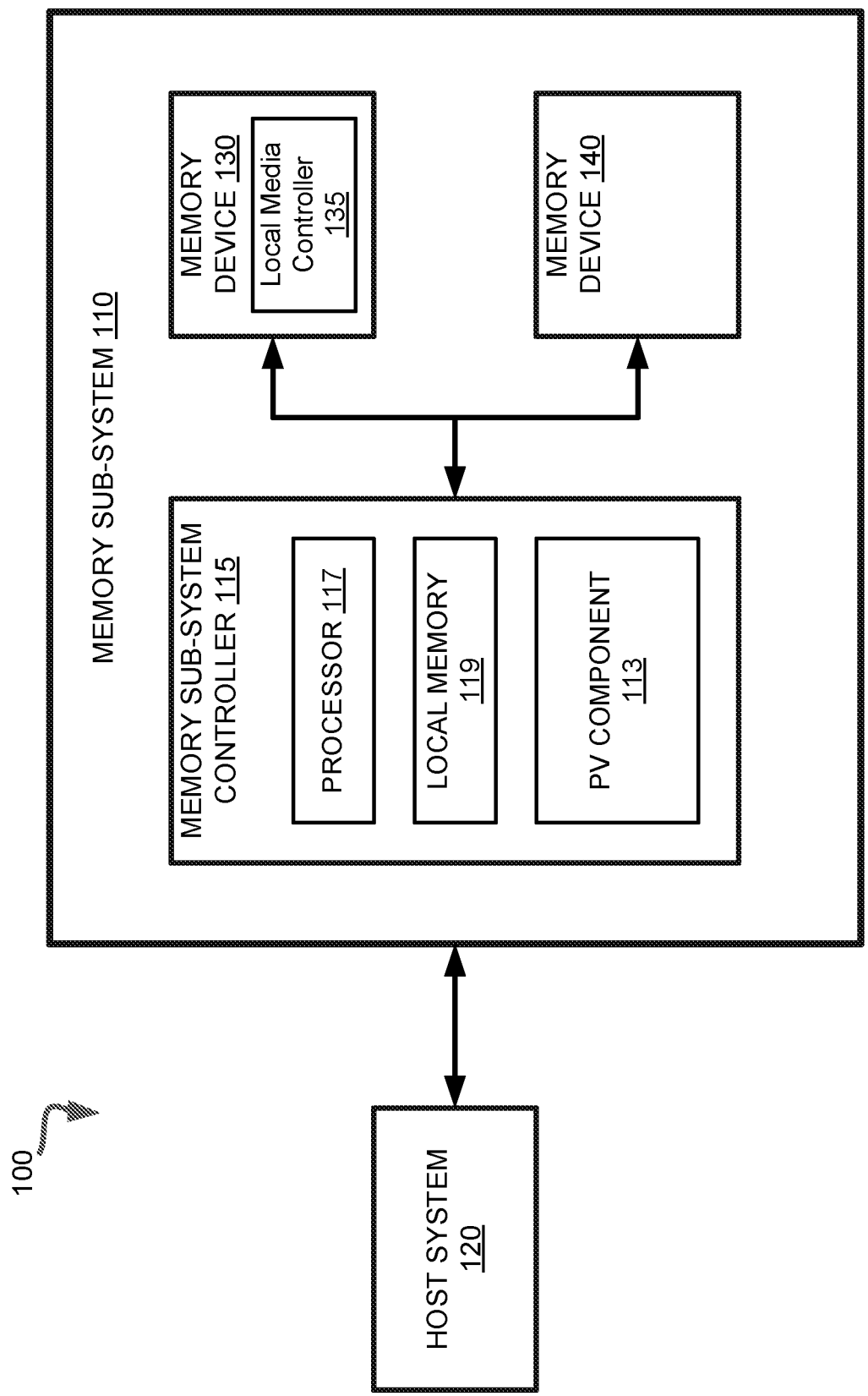
FIG. 1 illustrates an example computing system that includes a memory sub-system in accordance with some embodiments of the present disclosure.

Aspects of the present disclosure are directed to dynamic program-verify (PV) voltage adjustment for intra-block storage charge loss (SCL) uniformity. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell, thus determining a voltage signal $V_{CG}$ that has to be applied to a control electrode of the cell to open the cell to the flow of electric current across the cell, between the source electrode and the drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The memory cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can have distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing storing and reliably detecting multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

Program-verify (PV) is an operation performed during programming to determine whether memory cells are being programmed to their target memory states. However, one phenomenon observed in memory devices is storage charge loss (SCL), also referred to herein as temporal voltage shift (TVS), in which $V_t$ distributions shift to the left as charge diminishes over, e.g., time and/or temperature. That is, the $V_t$ distribution shift can be proportional to the elapsed time from a programming operation, and can cause a shift of PV voltages used to perform the PV operation. With SCL, it is possible to have varying levels of $V_t$ distribution shifts across different pages within a block if the programming of these pages is spaced significantly in time. As a result of this non-uniform $V_t$ shift, it may be difficult to determine an optimum set of read voltages that may be used for the majority of pages in the block without compromising performance. Selecting a non-optimal set of read voltages may result in higher error handling trigger rates and performance issues. Moreover, performing auto-calibration for every page read may increase read latency.

Aspects of the present disclosure address the above and other deficiencies by implementing a memory sub-system that dynamically adjusts PV voltage for intra-block SCL uniformity by proactively adjusting a reference PV voltage determined for a (programmed) reference page in a block. The reference page is a page in the block that is programmed temporally first relative to other pages in the block and, in some instances, can be the absolutely first programmed page in the block (i.e., the oldest or first programmed page in the block). The reference page can be a single page or can be included within a chunk of pages.

More specifically, the memory sub-system can determine (e.g., estimate) an amount of $V_t$ distribution shift of a reference $V_t$ distribution of the reference page over a given amount of time after the programming of the reference page. The amount of $V_t$ distribution shift can be determined based on a (quantifiable) metric derived from one or more parameters related to the reference page. As will be described in further detail herein, the metric can be derived from one or more parameters including read sense current, minimum read voltage, and time elapsed from the programming of the reference page.

The amount of $V_t$ distribution shift can then be used to determine amount of PV voltage change (relative to the reference PV voltage). From the amount of PV voltage change, an adjusted PV voltage can be obtained, which can be stored along with other programming metadata and subsequently used to perform a PV operation during programming of another page of the block at the given time (i.e., on the fly adjustment of the PV voltage). The adjusted PV voltage aligns the $V_t$ distribution of the page programmed at the given time with the reference $V_t$ distribution. A similar process can be used to determine additional adjusted PV voltages that can be used to perform PV operations during programming of additional other pages of the block at various times after the programming of the reference page. Thus, intra-block SCL uniformity can be realized by obtaining an adjusted PV voltage for each page that will be programmed in a block after a reference page to account for $V_t$ distribution shift.

For example, assume a case of a triple level cell (TLC) that stores three bits of information per memory cell, with eight total states. New or updated PV voltages can be obtained by subtracting old or previous PV voltages from a base shift voltage. More specifically, the base shift voltage can be modulated or adjusted based on a correction factor associated with a corresponding state. For example:

$$PV_{7_{new}} = PV7_{old} - V_{7_{shift}} \times cf_7$$

$$PV_{6_{new}} = PV6_{old} - V_{7_{shift}} \times cf_6$$

$$PV_{1_{new}} = PV1_{old} - V_{7_{shift}} \times cf_1$$

where $PV_{i_{new}}$ is a new PV voltage calculated for an i-th state, $PV_{i_{old}}$ is an old PV voltage calculated for the i-th state, $V_{7_{shift}}$ corresponds to the shift measured in state 7, and $cf_i$ is the correction factor for the i-th state. For example, $cf_7$ can be 1.0 and $cf_6$ can be 0.8. The correction factors can be obtained empirically from experimentation, and can be constant throughout the life of the memory device.

The $V_t$ distribution shift and PV voltage measurements and adjustments described herein can be implemented at the system level. For example, assuming that the system is an SSD, the measurements and adjustments can be implemented in the SSD if the controller/firmware of the SSD is doing the measurement and adjustment of the individual SSD NAND's PV. The SSD has an option to skip the measurements and adjustments if the time elapsed is not significant between the last writes.

Alternatively, the $V_t$ distribution shift and PV voltage measurements and adjustments described herein can be implemented at the component level. For example, assuming again that the memory device is an SSD, the NAND of the SSD, which has its own controller/firmware, can perform the measurements and adjustments itself during a write attempt. Such a component level implementation is transparent to the system (e.g., SSD).

The method can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and increase in transfer rate as compared to the FG NAND architecture.

Advantages of the present disclosure include, but are not limited to, improved scalability and write amplification minimization. Improved scalability is achieved by simplifying the determination of a single optimized set of read voltage levels, which reduces the need for more system memory for tracking partitions within a block. Write amplification is minimized since a block does not need to be abandoned after a certain time limit to maintain uniformity. Additionally, a single read bin can optimally be used.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a program-verify (PV) component 113 that can implement dynamic PV voltage adjustment for intra-block storage charge loss (SCL) uniformity. The PV component 113 can determine (e.g., estimate) at least one amount of $V_t$ distribution shift corresponding to at least one amount of time after programming of a reference page of a block (e.g., an oldest or first programmed page). In some embodiments, the PV component 113 derives a (quantifiable) metric from one or more parameters related to the reference page, and determines the amount of $V_t$ distribution shift based on the metric. More specifically, the metric can be derived from one or more parameters including read sense current, minimum read voltage, and time elapsed from the programming of the reference page.

The PV component 113 can adjust a PV voltage based on the amount of $V_t$ distribution shift to obtain an adjusted PV voltage. More specifically, the PV component 113 can determine, based on the amount of $V_t$ distribution shift, an amount of PV voltage change relative to a reference PV voltage corresponding to the reference page, and obtain the adjusted PV voltage by modifying the reference PV voltage based on the amount of PV voltage change. The PV component 113 can store the adjusted PV voltage as programming metadata. The PV component 113 can then program, using the programming metadata, a page of the block at a time corresponding to the amount of time after the programming of the reference page.

A similar process can be implemented by the PV component 113 to determine additional adjusted PV voltages that can be used to perform PV operations during programming of additional other pages of the block at various amounts times after the programming of the reference page. Thus, by aligning the reference page with pages that are subsequently programmed within the block, the PV component 113 can achieve $V_t$ uniformity across the block. Thus, intra-block SCL uniformity can be realized by obtaining an adjusted PV voltage for each page that will be programmed in a block after a reference page to account for $V_t$ distribution shift. The $V_t$ distribution shift and PV voltage adjustment can be determined at the system level or the component level.

For example, assume a case of a triple level cell (TLC) that stores three bits of information per memory cell, with eight total states. New or updated PV voltages can be obtained by subtracting old or previous PV voltages from a base shift voltage. More specifically, the base shift voltage can be modulated or adjusted based on a correction factor associated with a corresponding state. For example:

$$PV_{7_{new}} = PV7_{old} - V_{7_{shift}} \times cf_7$$

$$PV_{6_{new}} = PV6_{old} - V_{7_{shift}} \times cf_6$$

$$PV_{1_{new}} = PV1_{old} - V_{7_{shift}} \times cf_1$$

where $PV_{i_{new}}$ is a new PV voltage calculated for an i-th state, $PV_{i_{old}}$ is an old PV voltage calculated for the i-th state, $V_{7_{shift}}$ corresponds to the shift measured in state 7, and $cf_i$ is the correction factor for the i-th state. For example, $cf_7$ can be 1.0 and $cf_6$ can be 0.8. The correction factors can be obtained empirically from experimentation, and can be constant throughout the life of the memory device.

In some embodiments, the memory sub-system controller 115 includes at least a portion of the PV component 113. In some embodiments, the PV component 113 is part of the host system 110, an application, or an operating system. In other embodiments, local media controller 135 includes at least a portion of PV component 113 and is configured to perform the functionality described herein.

Further details regarding the operation of the PV component 113 are described below with reference to FIGS. 2 and 3.

FIG. 2 is a flow diagram of an example method 200 to implement dynamic program-verify (PV) voltage adjustment for intra-block storage charge loss (SCL) uniformity, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the PV component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic determines at least one amount of threshold voltage ($V_t$) distribution shift corresponding to at least one amount of time after programming of a reference page of a block of a memory device. The reference page can be single page or can be included in a chunk of pages. In one embodiment, the memory device is a RG NAND device.

More specifically, the reference page is a temporally first programmed page of the block. The term "temporally first" should be construed herein as representing a relative temporal relationship as opposed to an absolute temporal relationship. That is, a temporally first programmed page of a block is the earliest programmed page of a certain grouping of pages. A temporally subsequent page of the block is a page that is, or will be, programmed at some time after the temporally first programmed page. For example, the temporally first programmed page of a block can be denoted as $P_m$ and each temporally subsequent page of the block can be denoted as $P_{m+1}$, $P_{m+2}$, . . . where m is a positive integer. However, in one embodiment, the reference page be the first programmed page of the entire block (i.e., $P_1$).

In some embodiments, determining the $V_t$ shift includes determining an amount of $V_t$ shift based on a metric corresponding to the at least one reference page. More specifically, the metric can correspond to the $V_t$ of the at least one reference page. Determining the $V_t$ shift can further include defining the metric.

For example, defining the metric can include deriving the metric from at read sense current. As another example, defining the metric can include deriving the metric from minimum read voltage. As yet another example, defining the metric can include deriving the metric from time elapsed from programming of the reference page.

At operation 220, the processing logic adjusts the PV voltage based on the amount of $V_t$ distribution shift to obtain an adjusted PV voltage. More specifically, the adjusted PV voltage is a pre-characterized PV voltage that will be used to program a page of the block at a time after the programming of the reference page.

For example, assume a case of a triple level cell (TLC) that stores three bits of information per memory cell, with eight total states. New or updated PV voltages can be obtained by subtracting old or previous PV voltages from a base shift voltage. More specifically, the base shift voltage can be modulated or adjusted based on a correction factor associated with a corresponding state. For example:

$$PV_{7_{new}} = PV_{7_{old}} - V_{7_{shift}} \times cf_7$$

$$PV_{6_{new}} = PV_{6_{old}} - V_{7_{shift}} \times cf_6$$

$$PV_{1_{new}} = PV_{1_{old}} - V_{7_{shift}} \times cf_1$$

where $PV_{i_{new}}$ is a new PV voltage calculated for an i-th state, $PV_{i_{old}}$ is an old PV voltage calculated for the i-th state, $V_{7_{shift}}$ corresponds to the shift measured in state 7, and $cf_i$ is the correction factor for the i-th state. For example, $cf_7$ can be 1.0 and $cf_6$ can be 0.8. The correction factors can be obtained empirically from experimentation, and can be constant throughout the life of the memory device.

At operation 230, the adjusted PV voltage is stored as programming data. The programming data can further include any data (e.g., metadata) that can be used during page programming.

At operation 240, the processing logic programs, using the programming data, a temporally subsequent page of the block at a time corresponding to the amount of time after the programming of the reference page. More specifically, the adjusted PV voltage is used to perform a PV operation during programming. The adjusted PV voltage accounts for the $V_t$ distribution shift that occurred as a result of SCL between the time that the reference page was programmed and the time that the temporally subsequent page is being programmed.

Further details regarding operations 210-230 will now be described below with reference to FIG. 3.

Figure 3:
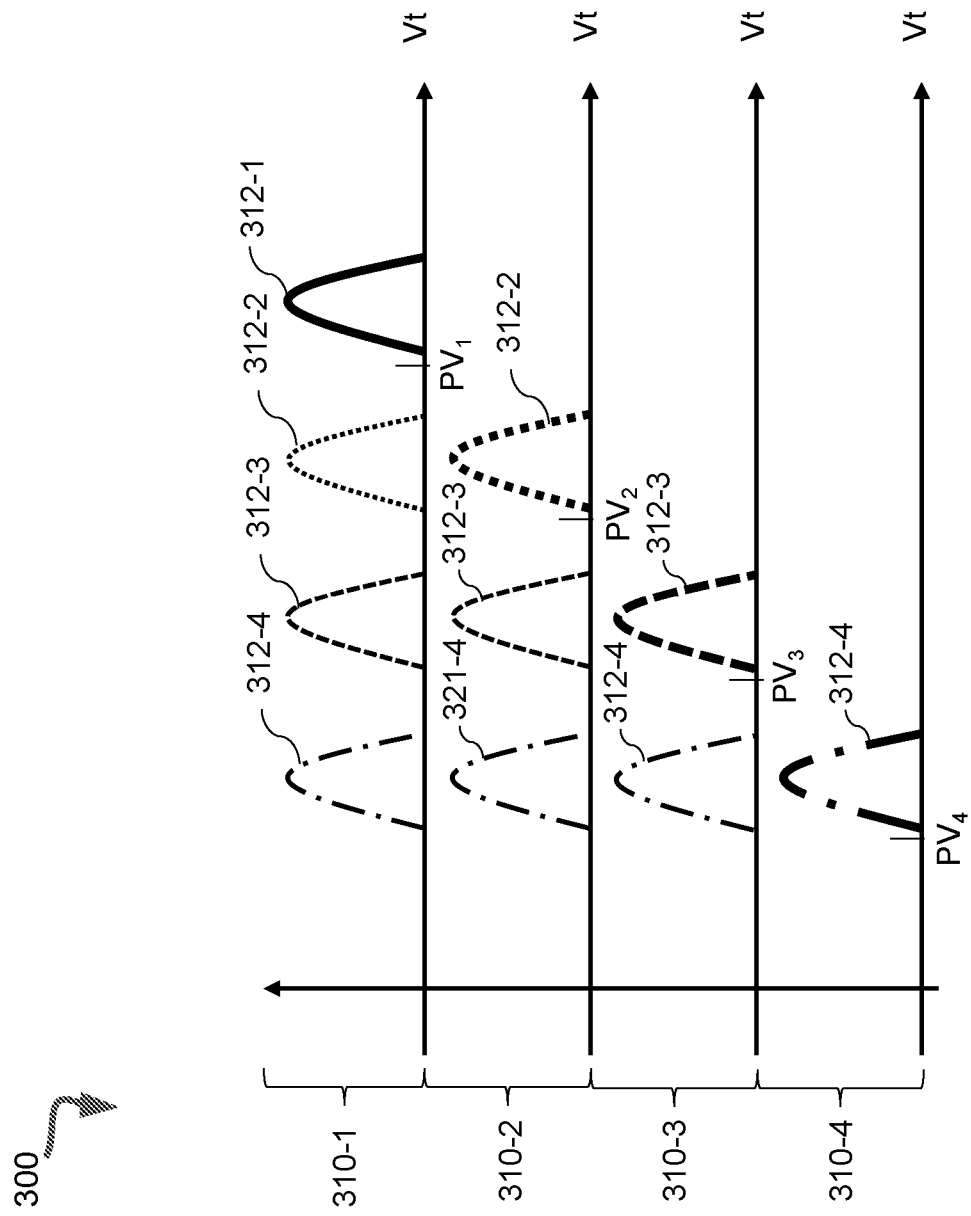
FIG. 3 is a diagram illustrating dynamic program-verify (PV) voltage adjustment for intra-block storage charge loss (SCL) uniformity based on a metric corresponding to a reference page in accordance with some embodiments of the present disclosure.

FIG. 3 illustrates a diagram 300 illustrating an example of dynamic program verification for intra-block storage charge loss (SCL) uniformity. More specifically, as will be described in further detail below, the diagram 300 shows a single threshold voltage (Vt) voltage with a program-verify (PV) voltage changing over time based on a metric corresponding to a Vt of a reference page.

Multiple graphs are shown, each corresponding to a respective page of a block. More specifically, graph 310-1 corresponds to a first page of the block, which is a reference page used as a basis for the PV voltage changes, graph 310-2 corresponds to a second page of the block, which is a first temporally subsequent page, graph 310-3 corresponds to a third page of the block, which is a second temporally subsequent page, and graph 310-4 corresponds to a fourth page of the block, which is a third temporally subsequent page.

As shown in graph 310-1, the first page is programmed at a first PV voltage ($PV_1$) corresponding to a first $V_t$ distribution 312-1 at programming time $t_1$. After an amount of time $n_1$, the first distribution 312-1 shifts to the left by some first amount due to SCL, and a second PV voltage ($PV_2$) is determined, which corresponds to a second distribution 312-2 for a page that will be programmed at time $t_2 = t_1 + n_1$. Continuing this process, after an amount of time $n_2$, the second distribution 312-2 shifts to the left by some second amount due to SCL, and a third PV voltage ($PV_3$), is determined, which corresponds to a third distribution 312-3 for a page that will be programmed at time $t_3 = t_2 + n_2$. Then, after an amount of time $n_3$, the third distribution 312-3 shifts to the left by some third amount due to SCL, and a fourth PV voltage ($PV_4$) is determined, which corresponds to a fourth distribution 312-4 for a page that will be programmed at time $t_4 = t_3 + n_3$. The amount of shift may not behave linearly over a linear time scale. In some embodiments, the amount of shift is linear over a logarithmic time scale. Accordingly, PV voltages can be proactively adjusted based on the reference PV voltage to account for $V_t$ shift over time during subsequent page programming, To address the Vt shift during subsequent page programming, each of the pre-characterized PV voltages shown in graph 310-1 are applied to respective ones of the new pages being programmed, which can result in a distribution that is close to that of the first page. The greater line weights of distributions 312-1, 312-2, 312-3 and 312-4 in graphs 310-1, 310-2, 310-3 and 310-4, respectively, indicate that $PV_1$, $PV_2$, $PV_3$ and $PV_4$ are being applied to the first page, the second page, the third page and the fourth page during programming, respectively.

As described above with reference to FIGS. 1-2, the PV voltages can be proactively adjusted based on a metric corresponding to the Vt distribution of the first (reference) page. The amount of shift between each of the distributions can be determined based on any suitable metric. One suitable metric is elapsed time, in which the amount of shift can be estimated based on respective ones of the elapsed times $n_1$ through $n_3$. For example, the amount of shift can be determined as a function of time, by using a table showing relationships between elapsed time and amount of shift, etc. Another suitable metric is direct measurement of an amount of change seen on the first page after some time. For example, if x is the amount of shift measured after $n_1$, $PV_2$ will be $PV_1$–x during programming of the second page.

Figure 4:
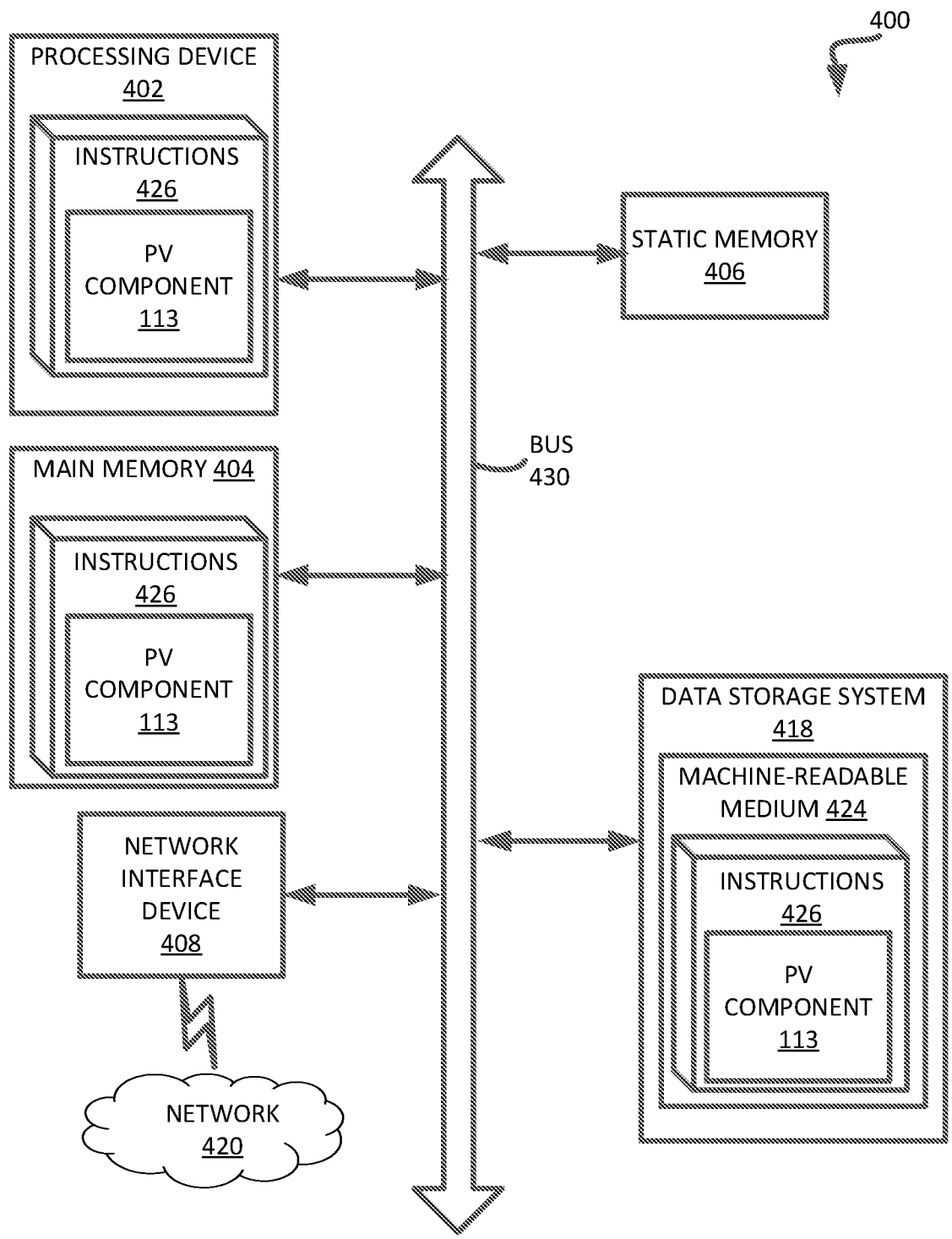
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the PV component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or RDRAM, etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 604 can correspond to the memory sub-system 110 of FIG. 1.

In one embodiment, the instructions 426 include instructions to implement functionality corresponding to a PV component (e.g., the PV component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
determining an amount of threshold voltage distribution shift corresponding to an amount of time after programming of a reference page of a block of the memory device;
obtaining a set of correction factors, each correction factor of the set of correction factors corresponding to a respective memory cell state of a set of memory cell states associated with the block, wherein each memory cell state of the set of memory cells states is associated with a respective program-verify voltage;
obtaining, for each memory cell state of the set of memory cell states, a respective adjustment value defined based on the amount of threshold voltage distribution shift multiplied by the correction factor for the memory cell state;
obtaining, for each memory cell state of the set of memory cell states, a respective adjusted program-verify voltage by subtracting the respective adjustment value from the respective program-verify voltage; and
programming, using the adjusted program-verify voltages, a subsequent, with respect to the reference page, page of the block.

2. The system of claim 1, wherein the reference page is a temporally first programmed page relative to the subsequent, with respect to the reference page, page.

3. The system of claim 2, wherein the reference page is an absolutely first programmed page of the block.

4. The system of claim 1, wherein determining the amount of threshold voltage distribution shift further comprises defining a metric derived from one or more parameters related to the reference page.

5. The system of claim 4, wherein defining the metric further comprises deriving the metric from read sense current.

6. The system of claim 4, wherein defining the metric further comprises deriving the metric from minimum read voltage.

7. The system of claim 4, wherein defining the metric further comprises deriving the metric from time elapsed from programming of the reference page.

8. A method comprising:
determining, by a processing device, an amount of threshold voltage distribution shift corresponding to an amount of time after programming of a reference page of a block of a memory device;
obtaining, by the processing device, a set of correction factors, each correction factor of the set of correction factors corresponding to a respective memory cell state of a set of memory cell states associated with the block, wherein each memory cell state of the set of memory cell states is associated with a respective program-verify voltage;
obtaining, by the processing device for each memory cell state of the set of memory cell states, a respective adjustment value defined based on the amount of threshold voltage distribution shift multiplied by the correction factor for the memory cell state;
obtaining, by the processing device for each memory cell state of the set of memory cell states, a respective adjusted program-verify voltage by subtracting the respective adjustment value from the respective program-verify voltage; and
programming, by the processing device using the adjusted program-verify voltages, a subsequent, with respect to the reference page, page of the block.

9. The method of claim 8, wherein the reference page is a temporally first programmed page relative to the subsequent, with respect to the reference page, page.

10. The method of claim 9, wherein the reference page is an absolutely first programmed page of the block.

11. The method of claim 8, wherein determining the amount of threshold voltage distribution shift further comprises defining a metric derived from one or more parameters related to the reference page.

12. The method of claim 11, wherein defining the metric further comprises deriving the metric from read sense current.

13. The method of claim 11, wherein defining the metric further comprises deriving the metric from minimum read voltage.

14. The method of claim 11, wherein defining the metric further comprises deriving the metric from time elapsed from programming of the reference page.

15. A non-transitory computer-readable storage medium comprising instructions that, when executed by a processing device, cause the processing device to perform operations comprising:

defining a metric derived from one or more parameters related to a reference page of a block of a memory device;

determining, based on the metric, an amount of threshold voltage shift corresponding to an amount of time after programming of the reference page;

obtaining a set of correction factors, each correction factor of the set of correction factors corresponding to a respective memory cell state of a set of memory cell states associated with the block, wherein each memory cell state of the set of memory cell states is associated with a respective program-verify voltage;

obtaining, for each memory cell state of the set of memory cell states, a respective adjustment value defined based on the amount of threshold voltage distribution shift multiplied by the correction factor for the memory cell state;

obtaining, for each memory cell state of the set of memory cell states, a respective adjusted program-verify voltage by subtracting the respective adjustment value from the respective program-verify voltage;

storing the adjusted program-verify voltages as programming data; and programming, using the programming data, a subsequent, with respect to the reference page, page of the block.

16. The non-transitory computer-readable storage medium of claim 15, wherein the reference page is a temporally first programmed page relative to the subsequent, with respect to the reference page, page.

17. The non-transitory computer-readable storage medium of claim 16, wherein the reference page is an absolutely first programmed page of the block.

18. The non-transitory computer-readable storage medium of claim 15, wherein defining the metric further comprises deriving the metric from read sense current.

19. The non-transitory computer-readable storage medium of claim 15, wherein defining the metric further comprises deriving the metric from minimum read voltage.

20. The non-transitory computer-readable storage medium of claim 15, wherein defining the metric further comprises deriving the metric from time elapsed from programming of the reference page.

* * * * *